(12) United States Patent
Kaneda et al.

(10) Patent No.: US 9,732,236 B2
(45) Date of Patent: Aug. 15, 2017

(54) CONDUCTIVE PASTE AND METHOD FOR PRODUCING CONDUCTIVE FILM USING SAME

(71) Applicant: DOWA ELECTRONICS MATERIALS CO., LTD., Tokyo (JP)

(72) Inventors: Shuji Kaneda, Okayama (JP); Hidefumi Fujita, Okayama (JP); Daisuke Itoh, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 15/103,440

(22) PCT Filed: Dec. 5, 2014

(86) PCT No.: PCT/JP2014/082904
§ 371 (c)(1),
(2) Date: Jun. 10, 2016

(87) PCT Pub. No.: WO2015/087989
PCT Pub. Date: Jun. 18, 2015

(65) Prior Publication Data
US 2016/0312043 A1  Oct. 27, 2016

(30) Foreign Application Priority Data

Dec. 10, 2013 (JP) .................... 2013-254606
Dec. 1, 2014 (JP) .................... 2014-243268

(51) Int. Cl.
*C09D 11/52* (2014.01)
*C09D 11/106* (2014.01)
(Continued)

(52) U.S. Cl.
CPC .............. *C09D 5/24* (2013.01); *C09D 7/12* (2013.01); *C09D 7/1225* (2013.01);
(Continued)

(58) Field of Classification Search
CPC ........ C09D 11/52; C09D 11/106; C09D 5/24; C09D 7/12; C09D 7/1225; C09D 129/14;
(Continued)

(56) References Cited

U.S. PATENT DOCUMENTS 7,262,511 B2 * 8/2007 Osako ............... H01L 24/29
 252/512
7,976,732 B2  7/2011 Kamada et al.
(Continued)

FOREIGN PATENT DOCUMENTS

EP  2530683  * 12/2012
JP  9-218508 A  8/1997
(Continued)

OTHER PUBLICATIONS

English translation of JP 2004/211108, Jul. 2004; 7 pages.*
(Continued)

*Primary Examiner* — Helene Klemanski
(74) *Attorney, Agent, or Firm* — Bachman & LaPointe, PC (57) ABSTRACT

After there is prepared a conductive paste which contains fine copper particles having an average particle diameter of 1 to 100 nm, each of the fine copper particles being coated with an azole compound, coarse copper particles having an average particle diameter of 0.3 to 20 μm, a glycol solvent, such as ethylene glycol, and at least one of a polyvinylpyrrolidone (PVP) resin and a polyvinyl butyral (PVB) resin and wherein the total amount of the fine copper particles and the coarse copper particles is 50 to 90% by weight, the weight ratio of the fine copper particles to the coarse copper particles being in the range of from 1:9 to 5:5, the conductive paste thus prepared is applied on a substrate by screen printing to be preliminary-fired by vacuum drying, and then, fired with light irradiation by irradiating with light having a
(Continued)

wavelength of 200 to 800 nm at a pulse period of 500 to 2000 μs and a pulse voltage of 1600 to 3800 V to form a conductive film on the substrate.

8 Claims, 1 Drawing Sheet

(51) Int. Cl.

| | |
|---|---|
| *C09D 5/24* | (2006.01) |
| *C09D 7/12* | (2006.01) |
| *C09D 129/14* | (2006.01) |
| *C09D 139/06* | (2006.01) |
| *C08K 9/04* | (2006.01) |
| *C08K 9/10* | (2006.01) |
| *H01B 1/22* | (2006.01) |
| *H05K 1/09* | (2006.01) |
| *H05K 3/12* | (2006.01) |

(52) U.S. Cl.
CPC ............ *C09D 11/106* (2013.01); *C09D 11/52* (2013.01); *C09D 129/14* (2013.01); *C09D 139/06* (2013.01); *H01B 1/22* (2013.01); *H05K 1/097* (2013.01); *H05K 3/1216* (2013.01); *H05K 3/1283* (2013.01); *C08K 9/04* (2013.01); *C08K 2201/001* (2013.01); *C08K 2201/003* (2013.01)

(58) Field of Classification Search
CPC .......... C09D 139/06; C08K 9/04; C08K 9/10; C08K 2201/001; C08K 2201/003; H01B 1/22; H05K 1/097; H05K 3/1216; H05K 3/1283
USPC ........................................ 106/31.92; 252/512
See application file for complete search history.

(56) References Cited

U.S. PATENT DOCUMENTS

| | | | | |
|---|---|---|---|---|
| 8,758,475 B2 * | 6/2014 | Itoh | ...................... | H05K 3/1283 |
| | | | | 75/255 |
| 9,006,296 B2 * | 4/2015 | Itoh | .......................... | C09D 5/24 |
| | | | | 106/1.18 |
| 9,248,504 B2 * | 2/2016 | Kaneshiro | ................. | H01B 1/22 |
| 2006/0236813 A1 * | 10/2006 | Zhao | ......................... | B22F 9/24 |
| | | | | 75/711 |
| 2008/0014359 A1 | 1/2008 | Kamada et al. | | |
| 2008/0286488 A1 | 11/2008 | Li et al. | | |
| 2016/0007455 A1 | 1/2016 | Kawato et al. | | |
| 2016/0346838 A1 * | 12/2016 | Fujita | ...................... | C09D 5/24 |

FOREIGN PATENT DOCUMENTS

| | | | |
|---|---|---|---|
| JP | 2004-211108 A | | 7/2004 |
| JP | 2007-258123 A | | 10/2007 |
| JP | 2008-285761 A | | 11/2008 |
| JP | 2010-21101 A | | 1/2010 |
| JP | 2010-528428 A | | 8/2010 |
| JP | 2012-243655 A | | 12/2012 |
| JP | 2013-161544 A | | 8/2013 |
| JP | 2014-225338 A | | 12/2014 |
| WO | WO 2010/032841 A1 | * | 3/2010 |
| WO | WO 2015/068826 A1 | * | 5/2015 |

OTHER PUBLICATIONS

English translation of JP 2012/243655, Dec. 2012; 12 pages.*
English translation of JP 2013/161544, Aug. 2013; 10 pages.*
English translation of JP 2008/285761, Nov. 2008; 6 pages.*
English translation of the Written Opinion of the International Search Authority mailed Feb. 10, 2015 for PCT/JP2014/079657; 4 pages.*
International Search Report for PCT/JP2014/082904 dated Feb. 19, 2015.

* cited by examiner

CONDUCTIVE PASTE AND METHOD FOR PRODUCING CONDUCTIVE FILM USING SAME

TECHNICAL FIELD

The present invention relates generally to a conductive paste. More specifically, the invention relates to a conductive paste for use in the production of a conductive film for forming electrodes and circuits of electronic parts and so forth, and a method for producing a conductive film using the same.

BACKGROUND ART

As a conventional method for producing a conductive film using a conductive paste, there is proposed a method for applying a photosensitive paste, which contains fine inorganic particles, such as fine glass particles, a photosensitive organic constituent, and a compound having an azole structure, such as benzotriazole, on a substrate to expose, develop and fire the applied paste to form a pattern (of a conductive film) (see, e.g., Japanese Patent Laid-Open No. 9-218508). There is also proposed a method for printing a copper ink solution containing copper nanoparticles on the surface of a substrate, and then, causing the printed solution to be dried and exposed to pulses for fusing copper nanoparticles with light sintering, to produce a light-sintered copper nanoparticle film (a conductive film) (see, e.g., Japanese Patent Laid-Open. No. 2010-528428). Moreover, there is proposed a conductive ink using, as a conductive filler, fine copper particles, each of which has benzotriazole deposited on the surface thereof as a process for improving resistance to oxidation (see, e.g., Japanese Patent Laid-Open No. 2008-285761).

However, in the method disclosed in Japanese Patent Laid-Open No. 9-218508, it is required to apply the photosensitive paste on the substrate to cause the applied paste to be exposed and developed with a developing agent, and then, to be fired at a high temperature (520 to 610° C.), so that the process is complicated. In addition, it is not possible to fire the paste with light irradiation, and it is not possible to form the pattern on a substrate, which is easily affected by heat, such as a paper or a polyethylene terephthalate (PET) film. In the method disclosed in Japanese Patent Laid-Open No. 2010-528428, the storage stability of the copper ink solution containing copper nanoparticles is not sufficient, and the adhesion thereof to a substrate, such as a paper, is not sufficient. Moreover, if the conductive ink disclosed in Japanese Patent Laid-Open No. 2008-285761 is used as a conductive paste for light firing, when the solution is applied on the substrate to be dried and fired with light irradiation to form the conductive film, cracks are formed in the conductive film to deteriorate the electrical conductivity of the film.

DISCLOSURE OF THE INVENTION

It is therefore an object of the present invention to eliminate the aforementioned problems and to provide a conductive paste, which is able to form a conductive film having good adhesion to a substrate and a good electrical conductivity with light firing and which has a good storage stability, and a method for producing a conductive film using the same.

In order to accomplish the aforementioned and other object, the inventors have diligently studied and found that it is possible to produce a conductive paste, which is able to form a conductive film having good adhesion to a substrate and a good electrical conductivity with light firing and which has a good storage stability, if fine copper particles having an average particle diameter of 1 to 100 nm, each of which is coated with an azole compound, coarse copper particles having an average particle diameter of 0.3 to 20 µm, and at least one of a polyvinylpyrrolidone (PVP) resin and a polyvinyl butyral (PVB) resin are added to a glycol solvent. Thus, the inventors have made the present invention.

According to the present invention, there is provided a conductive paste comprising: fine copper particles having an average particle diameter of 1 to 100 nm, each of the fine copper particles being coated with an azole compound; coarse copper particles having an average particle diameter of 0.3 to 20 µm; a glycol solvent; and at least one of a polyvinylpyrrolidone resin and a polyvinyl butyral resin. In this conductive paste, the total amount of the fine copper particles and the coarse copper particles is preferably 50 to 90% by weight, and the weight ratio of the fine copper particles to the coarse copper particles is preferably in the range of from 1:9 to 5:5. The azole compound is preferably benzotriazole, and the glycol solvent is preferably ethylene glycol. The conductive paste preferably further comprises a dispersing agent. When the conductive paste contains the polyvinylpyrrolidone resin, the amount of the polyvinylpyrrolidone resin in the conductive paste is preferably 3 to 9% by weight with respect to the total amount of the fine copper particles and the coarse copper particles. When the conductive paste contains the polyvinyl butyral resin, the amount of the polyvinyl butyral resin in the conductive paste is preferably 3 to 6% by weight with respect to the total amount of the fine copper particles and the coarse copper particles.

According to the present invention, there is provided a method for producing a conductive film, the method comprising the steps of: applying the above-described conductive paste on a substrate; and causing the applied paste to be preliminary-fired, and then, to be fired with light irradiation to form a conductive film on the substrate. In this method for producing a conductive film, the applying of the conductive paste is preferably carried out by screen printing, and the preliminary-firing is preferably carried out by vacuum drying at 50 to 200° C. The light irradiation is preferably carried out by irradiating with light having a wavelength of 200 to 800 nm at a pulse period of 500 to 2000 µs and a pulse voltage of 1600 to 3800 V. The conductive film preferably has a thickness of 1 to 30 µm.

According to the present invention, it is possible to provide a conductive paste, which is able to form a conductive film having good adhesion to a substrate and a good electrical conductivity with light firing and which has a good storage stability, and a method for producing a conductive film using the same.

BEST MODE FOR CARRYING OUT THE INVENTION

The preferred embodiment of a conductive paste according to the present invention, comprises: fine copper particles having an average particle diameter of 1 to 100 nm, each of the fine copper particles being coated with an azole compound; coarse copper particles having an average particle diameter of 0.3 to 20 µm; a glycol solvent; and at least one of a polyvinylpyrrolidone resin and a polyvinyl butyral resin.

The fine copper particles having an average particle diameter of 1 to 100 nm are easily sintered. If the surface of each of such fine copper particles is coated with an azole compound, it is possible to improve the storage stability of the fine copper particles, and it is possible to improve the light absorbability thereof, so that the fine copper particles are easily sintered with light irradiation. In particular, since the azole compound has a conjugated double band in the molecule thereof, it is designed to absorb light having a wavelength range (200-400 nm) of ultraviolet rays to convert the absorbed light to heat for causing the fine copper particles to be easily sintered.

The coarse copper particles having an average particles diameter of 0.3 to 20 µm are designed to restrain the contraction of a conductive film due to the sintering of the fine copper particles to prevent cracks from being formed in the conductive film to prevent the electrical conductivity thereof from being deteriorated when the copper particles are fired with light irradiation to form the conductive film. The coarse copper particles are also designed to restrain the deterioration of the electrical conductivity of the conductive film even if the thickness thereof is increased.

In this conductive paste, the total amount of the fine copper particles and coarse copper particles is preferably 50 to 90% by weight, and more preferably 60 to 80% by weight. The ratio of the weight of the fine copper particles to the weight of the coarse copper particles is preferably in the range of from 1:9 to 5:5 (from 1/9 to 5/5). The azole compound is preferably benzotriazole.

When the conductive paste is applied on a substrate, such as a paper, to form a conductive film, the solvent of the conductive paste is preferably water-soluble in order to improve the wettability of the substrate, and preferably has a hydroxyl group which has the function of reducing copper being easily oxidizable. The solvent preferably has a boiling point of not lower than 180° C. so that the conductive paste can be continuously printed on the substrate. As a solvent having such characteristics, the glycol solvent is preferably used in the preferred embodiment of a conductive paste according to the present invention.

As the glycol solvent, there can be used ethylene glycol, isopropylene glycol, 1.6-hexanediol, 1,3-propanediol, 1,4-butanediol, dipropylene glycol, 1,5-pentanediol, diethylene glycol, polyethylene glycol (having a molecular weight of about 200), methylpentanediol, triethylene glycol and so forth, and there is preferably used ethylene glycol.

When the conductive paste is applied on a substrate, such as a paper, to form a conductive film, the resin contained in the conductive paste is preferably a resin which can improve the adhesion of the conductive paste to the substrate, which can be intensely dissolved in a glycol solvent to cause the conductive paste to have suitable viscosity and sagging, and which can form a flexible conductive film. As a resin having such characteristics, at least one of a polyvinylpyrrolidone (PVP) resin and a polyvinyl butyral (PVB) resin is used in the preferred embodiment of a conductive paste according to the present invention.

When the conductive paste contains the polyvinylpyrrolidone resin, the amount of the polyvinylpyrrolidone resin in the conductive paste is preferably 3 to 9% by weight with respect to the total amount of the fine copper particles and coarse copper particles. When the conductive paste contains the polyvinyl butyral resin, the amount of the polyvinyl butyral resin in the conductive paste is preferably 3 to 6% by weight with respect to the total amount of the fine copper particles and coarse copper particles.

As the polyvinylpyrrolidone resin, there can be used, e.g., PITZCOL K-30 (Weight-Average Molecular Weight 45,000) and PITZCOL K-90 (Weight-Average Molecular Weight 1,200,000) commercially available from DKS Co., Ltd.), PVP K-25 (Weight-Average Molecular Weight 20,000) commercially available from Wako Pure Chemical Industries, Ltd., and so forth. As the polyvinyl butyral resin, there can be used, e.g., S-LEC B-Series and S-LEC K-Series commercially available from Sekisui Chemical Co., Ltd., Mowital B-Series commercially available from Kuraray Co., Ltd., and so forth.

In the conductive paste, a dispersing agent is preferably added to the solvent in order to improve the dispersibility of the fine copper particles. The amount of the dispersing agent to be added is preferably in the range of from 0.1% by weight to 10% by weight with respect to the conductive paste, and more preferably in the range of from 0.1% by weight to 2% by weight with respect to the conductive paste. As such a dispersing agent, there may be used a dispersing agent which is compatible with the surface of the fine copper particles and which is compatible with the glycol solvent.

As examples of dispersing agents having such characteristics, there are dispersing agents of surfactants, such as non-ionic polyoxyethylene (e.g., TRITON X-100 commercially available from Sigma-Aldrich. Co., Ltd.), polyoxyethylene (8) octylphenylether (e.g., TRITON X-114 commercially available from sigma-Aldrich Co., Ltd.), high-molecular-weight block copolymer (e.g., DISPERBYK-190 commercially available from BYK-Chmemie Japan, Co., Ltd.), denaturated acrylic block copolymer (e.g., DISPER-BYK-2000 and DISPERBYK-2001 commercially available from BYK-Chmemie Japan, Co., Ltd.), non-ionic fluorinated polyoxyethylene (e.g., Zonyl FS300 commercially available from Du Pont Kabushiki Kaisha), fluorine group/hydrophilic group containing oligomer (e.g., MEGAFAC EXP TF-1540, MEGAFAC EXP TF-1878 and MEGAFAC F-480'SF commercially available from DIC Corporation), lauryl trimethyl ammonium chloride (e.g., Cortamine 24P commercially available from Kao Corporation), polyoxyethylene palmalkyl amine (e.g., AMIET 102 commercially available from Kao Corporation), polyoxyethylene distyrenized phenylether (e.g., EMULGEN A-60 commercially available from Kao Corporation), specialized polycarboxylic acid type surfactant (e.g., DEMOL EE Kao Corporation), ammonium salt of naphthalene sulfonate formaldehyde condensate (e.g., MX-2045L commercially available from Kao Corporation), polyoxyethylene-lauryl amine (e.g., NYMEEN L-202 and MARIARIM HKM-150A commercially available from NOF Corporation), ammonium salt of half ester copolymer of styrene-maleic acid (e.g., DKS DISCOAT N-14 commercially available from DKS Co., Ltd.), polyoxyethylene styrenized phenylether (e.g., NOI-GEN EA-167 commercially available from DKS Co., Ltd.), polyoxyethylene (20) nonylphenylether (e.g., commercially available from Wako Pure Chemical Industries, Ltd.), cationic surfactant (e.g., NOPCO SPARSE 092 commercially available from SAN NOPCO LIMITED), and ethylene oxide additive of acetylenediol (e.g., Dynol 604 commercially available from Nissin Chemical Co., Ltd.).

The conductive paste may contain an addition agent, such as a rheology control agent, an adhesion giving agent and a defoaming agent.

Furthermore, in the preferred embodiment of a method for producing a conductive film, kneading and defoaming are preferably carried out by means of a defoaming mixer, a three-roll mill, a planet ball mill, a bead mill, a mortar or the like.

In the preferred embodiment of a method for producing a conductive film, the above-described conductive paste is applied on a substrate to be preliminary-fired, and then, fired with light irradiation to form a conductive film on the substrate.

In this method for producing a conductive film, the applying of the conductive paste is preferably carried out by screen printing. The preliminary-firing of the applied paste is preferably carried out by heating the applied paste by means of a vacuum dryer, an IR lamp heater or the like. When the preliminary-firing is carried out by means of a vacuum dryer, vacuum drying is preferably carried out at 50 to 200 t for 10 to 180 minutes. When the preliminary-firing is carried out by means of an IR lamp heater, the applied paste is preferably heated at a quantity of heat of 140 to 600 J for 5 to 20 seconds in the atmosphere. The light irradiation is preferably carried out by irradiating with light having a wavelength of 200 to 800 nm at a pulse period of 500 to 2000 μs and a pulse voltage of 1600 to 3800 V. The light irradiation can be carried out by irradiating with light by means of a xenon flash lamp or the like, and can be carried out in a short period of time in the atmosphere. The light irradiation may be repeated several times. By this light irradiation, it is possible to form a conductive film which has a thickness of 1 to 30 μm and which has a good electrical conductivity.

Throughout the specification, the expression "average particle diameter" means an average primary particle diameter calculated from a field emission type scanning electron microscope (FE-SEM). The "average primary particle diameter" can be calculated as follows. For example, the fine copper particles or the coarse copper particles are observed by means of a field emission type scanning electron microscope (FE-SEM) (S-4700 produced by Hitachi Ltd.) a predetermined magnification (a magnification of 100,000 when the fine copper particles are observed, and a magnification of 2,000 to 20,000 in accordance with the shape and/or size of the coarse copper particles when the coarse copper particles are observed). Then, optional 100 fine copper particles or 100 coarse copper particles on the FE-SEM image (a plurality of FE-SEM images if necessary) are selected at random. Then, the particle diameter (the long diameter on the image) of each of the selected particles (primary particles) is measured. By the number average of the measured particle diameters, the average particle diameter of the coarse or fine copper particles can be calculated (as the number average particle diameter).

Examples of a conductive paste and a method for producing a conductive film using the same according to the present invention will be described below in detail.

EXAMPLE 1

First, there were prepared a solution A obtained by allowing 280 g of copper sulfate pentahydrate (commercially available from JX Nippon Mining & Metals Corporation) serving as a copper source and 1 g of benzotriazole (ETA) (commercially available from Wako Pure Chemical Industries, Ltd.) to be dissolved in 1330 g of pure water, a solution B obtained by allowing 200 g of an aqueous solution containing 50% by weight of sodium hydroxide (commercially available from Wako Pure Chemical Industries, Ltd.) serving as a neutralizer to be diluted with 900 g of pure water, and a solution C obtained by allowing 150 g of 80% by weight of hydrazine monohydrate (commercially available from Otsuka Chemical Co., Ltd.) as a reducing agent to be diluted with 1300 g of pure water.

Then, the solution A and the solution B were mixed with each other while being stirred, and the temperature of the mixed solution was adjusted to 60° C. Thereafter, while maintaining the stirring, all of the solution C was added to the mixed solution within 30 seconds. After about 5 minutes, the reaction was completed to produce a slurry. The solid-liquid separation of the slurry was carried out to obtain a solid material. Then, ethylene glycol (EG) (commercially available from Wako Pure Chemical Industries, Ltd.) was allowed to pass through the solid material to obtain a dispersing solution in which fine copper particles coated with BTA are dispersed in ethylene glycol. The fine copper particles in this dispersing solution were observed by means of a field emission type scanning electron microscope (FE-SEM) (S-4700 produced by Hitachi Ltd.). As a result, the fine copper particles were substantially spherical fine particles (coated with BTA). The average particle diameter of the fine copper particles was calculated. As a result, the average particle diameter thereof was about 50 nm. The content of copper in the dispersing solution was obtained by the differential analysis of the dispersing solution in $N_2$. As a result, the content of copper therein was 68% by weight.

Then, a surfactant of ammonium salt of naphthalene sulfonate formaldehyde condensate (MX-2045L commercially available from Kao Corporation) serving as a dispersing agent, polyvinylpyrrolidone (PVP) resin having a weight-average molecular weight of 45,000 (PITZCOL K-30 commercially available from DKS Co., Ltd.), flake-shaped coarse copper particles having an average particle diameter of 12 μm were added to the dispersing solution of the fine copper particles coated with BTA (so that the ratio of the weight of the fine copper particles coated with BTA to the weight of the flake-shaped coarse copper particles was 3:7). Thus, there was obtained a conductive paste containing the fine copper particles coated with BTA (conductive filler 1) and the flake-shaped coarse copper particles (conductive filler 2) as conductive fillers. Furthermore, after the PVP resin was added so as to have a content of 3% by weight with respect to the amount of the conductive fillers (the total amount of the fine copper particles and coarse copper particles (copper particles)) and after ethylene glycol was add to be adjusted so that the content of the conductive fillers in the conductive filler was 67% by weight, a rotary and revolutionary vacuum defoaming mixer (V-mini 30 produced by EME Co., Ltd.) was used for causing the conductive paste to be rotated at a rotation speed of 1400 rpm for 60 seconds to knead and defoam the conductive paste so as to uniformly disperse the conductive fillers.

Then, a screen printing plate having the number meshes of 500 LPI, a wire diameter of 18 μm, a gauze thickness of 29 μm and an emulsion thickness of 5 μm (SC500-18-29 commercially available from SONOCOM Co., Ltd.) was used for causing the above-described conductive paste to be printed in a substantially rectangular shape having a size of 50 mm×0.5 mm on a substrate (an ink jet printing paper commercially available from Eastman Kodak Company) by screen printing. After the printed conductive paste was vacuum dried at 100° C. for 60 minutes as preliminary-firing to obtain a preliminary-fired film, a pulse irradiating apparatus (Sinteron 2000 produced by Xenon Corporation) was used for irradiating the preliminary-fired film with light having a wavelength of 200 to 800 nm at a pulse period of 2000 μs and a pulse voltage of 2200 V by means of a xenon flash lump to fire the preliminary-fired film to obtain a conductive film.

The thickness of the conductive film was obtained by calculating an average value of height differences between the surface of the conductive film and the surface of the substrate having the conductive film, the height differences being measured at 100 spots by means of a laser microscope (VK-9700 produced by KEYENCE CORPORATION). As a result, the thickness of the conductive film was 4.6 μm. The electrical resistance (line resistance) of the conductive film was measured by means of a tester (CDM-03D produced by CUSTOM CORPORATION). As a result, the electrical resistance was 4.4Ω. The volume resistivity of the conductive film was obtained from the thickness, electrical resistance and area of the conductive film. As a result, the volume resistivity was 20.0 μΩ·cm.

In order to evaluate the adhesion of the conductive paste to the substrate, a cellophane tape having a width of 24 mm (Nichiban Co., Ltd.) was applied on the conductive film formed on the substrate, and a load of about 5 kg was applied thereon. Then, the cellophane tape was rubbed at the load so as to remove bubbles between the wiring and the cellophane tape. Thus, the bubbles were removed to allow the cellophane tape to be adhered to the substrate. Thereafter, the substrate was fixed, and the cellophane tape was lifted to be stripped in a period of time of about 0.6 seconds without stopping so that the angle between the substrate and the tape was carefully maintained to be about 90 degrees. When no separated part of the conductive film was adhered to the tape, it was evaluated that the adhesion of the conductive film was very good. When the separated part of the conductive film was hardly adhered to the tape, it was evaluated that the adhesion of the conductive film was good. When only a part of the edge of the conductive film was peeled off, it was evaluated that the adhesion of the conductive film was not good. When the conductive film was broken so that it was not possible to measure the line resistance thereof, it was evaluated that the adhesion of the conductive film was bad. As a result, the adhesion of the wiring was good in this example.

After the conductive paste obtained in this example was allowed to stand at room temperature in an atmosphere of nitrogen for one month, the presence of aggregation was checked with eyes. As a result, no aggregation was observed. The conductive paste after being thus allowed to stand for one month was used for producing a conductive film by the same method as the above-described method. As a result, the electrical resistance and volume resistivity of the conductive film were hardly varied.

EXAMPLES 2 AND 3

Conductive pastes (conductive filler: 67% by weight) were obtained by the same method as that in Example 1, except that the amount of the polyvinylpyrrolidone (PVP) resin to be added was 6% by weight (Example 2) and 9% by weight (Example 3), respectively, with respect to the conductive filler.

These conductive pastes were used for producing conductive films by the same method as that in Example 1, except that a screen printing plate having the number of meshes of 250 LPI, a wire diameter of 30 μm, a gauze thickness of 60 μm and an emulsion thickness of 5 μm (ST250-30-60 commercially available from SONOCOM Co., Ltd.) was used as the screen printing plate and that the pulse voltage was 2400 V (Example 2) and 2600 V (Example 3), respectively. By the same methods as those in Example 1, the thickness of each of the conductive films was obtained, and the electrical resistance (line resistance) thereof was measured. In addition, the volume resistivity thereof was obtained, and the adhesion thereof to the substrate was evaluated. As a result, the thickness of the conductive film was 13.3 μm (Example 2) and 17.8 μm (Example 3), respectively, and the electrical resistance (line resistance) thereof was 1.6 (Example 2) and 2.5Ω (Example 3), respectively. The volume resistivity thereof was 21.0 μΩ·cm (Example 2) and 45.0 μΩ·cm (Example 3), respectively. With respect to the conductive films obtained in Examples 2 and 3, the adhesion thereof to the substrate was good.

After each of the conductive pastes obtained in these examples was allowed to stand at room temperature in an atmosphere of nitrogen for one month, the presence of aggregation was checked with eyes. As a result, no aggregation was observed. The conductive pastes after being thus allowed to stand for one month were used for producing conductive films by the same method as the above-described method. As a result, the electrical resistance and volume resistivity of each of the conductive films were hardly varied.

EXAMPLE 4

A conductive paste (conductive filler: 67% by weight) was obtained by the same method as that in Example 1, except that a polyvinylpyrrolidone (PVP) resin having a weight-average molecular weight of 1,200,000 (PITZCOL K-90 commercially available from DKS Co., Ltd.) was added in place of the polyvinylpyrrolidone (PVP) resin having a weight-average molecular weight of 45,000.

This conductive paste was used for producing a conductive film by the same method as that in Example 1, except that the pulse voltage was 2000 V. By the same methods as those in Example 1, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 6.7 μm, and the electrical resistance (line resistance) thereof was 5.7Ω. The volume resistivity thereof was 38.0 μΩ·cm, and the adhesion thereof to the substrate was good.

After the conductive paste obtained in this example was allowed to stand at room temperature in an atmosphere of nitrogen for one month, the presence of aggregation was checked with eyes. As a result, no aggregation was observed. The conductive paste after being thus allowed to stand for one month was used for producing a conductive film by the same method as the above-described method. As a result, the electrical resistance and volume resistivity of each of the conductive films were hardly varied.

EXAMPLE 5

A conductive paste (conductive filler: 67% by weight) was obtained by the same method as that in Example 1, except that a polyvinylpyrrolidone (PVP) resin having a weight-average molecular weight of 20,000 (PVP K-25 commercially available from Wako Pure Chemical Industries, Ltd.) was added in place of the polyvinylpyrrolidone (PVP) resin having a weight-average molecular weight of 45,000 and that the amount thereof to be added was 9% by weight with respect to the conductive filler.

This conductive paste was used for producing a conductive film by the same method as that in Example 2. By the same methods as those in Example 2, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 12.9 μm, and the electrical resistance (line resistance) thereof was 3.8Ω. The volume resistivity thereof was 49.0 μΩ·cm, and the adhesion thereof to the substrate was good.

After the conductive paste obtained in this example was allowed to stand at room temperature in an atmosphere of nitrogen for one month, the presence of aggregation was checked with eyes. As a result, no aggregation was observed. The conductive paste after being thus allowed to stand for one month was used for producing a conductive film by the same method as the above-described method. As a result, the electrical resistance and volume resistivity of each of the conductive films were hardly varied.

EXAMPLES 6-8

Conductive pastes were obtained by the same method as that in Example 1, except that the amount of the polyvinylpyrrolidone (PVP) resin to be added was 3% by weight (Example 6), 6% by weight (Example 7) and 9% by weight (Example 8), respectively, with respect to the conductive filler and that the concentration of the conductive filler (copper particles) was 73% by weight.

These conductive pastes were used for producing conductive films by the same method as that in Example 2, except that the pulse voltage was 2800 V. By the same methods as those in Example 2, the thickness of each of the conductive films was obtained, and the electrical resistance (line resistance) thereof was measured. In addition, the volume resistivity thereof was obtained, and the adhesion thereof to the substrate was evaluated. As a result, the thickness of the conductive film was 18.0 μm (Example 6), 20.4 μm (Example 7) and 23.8 μm (Example 8), respectively, and the electrical resistance (line resistance) thereof was 1.7Ω (Example 6), 2.3Ω (Example 7 and 3.8Ω (Example 8), respectively. The volume resistivity thereof was 31.0 μΩ·cm (Example 6), 47.0 μΩ·cm (Example 7) and 90.0 μΩ·cm (Example 8), respectively. The adhesion thereof to the substrate was very good with respect to the conductive films obtained in Examples 6 and 7, and the adhesion thereof to the substrate was good with respect to the conductive film obtained in Example 8.

After each of the conductive pastes obtained in these examples was allowed to stand at room temperature in an atmosphere of nitrogen for one month, the presence of aggregation was checked with eyes. As a result, no aggregation was observed. The conductive pastes after being thus allowed to stand for one month were used for producing conductive films by the same method as the above-described method. As a result, the electrical resistance and volume resistivity of each of the conductive films were hardly varied.

EXAMPLES 9 AND 10

Conductive pastes (conductive filler: 67% by weight) were obtained by the same method as that in Example 3, except that the ratio of the weight of the BTA-coated fine copper particles to the weight of the flake-shaped coarse copper particles was 4:6 (Example 9) and 1:9 (Example 10), respectively.

These conductive pastes were used for producing conductive films by the same method as that in Example 2, except that the pulse voltage was 2800 V (Example 9) and 2600 V (Example 10), respectively. By the same methods as those in Example 2, the thickness of each of the conductive films was obtained, and the electrical resistance (line resistance) thereof was measured. In addition, the volume resistivity thereof was obtained, and the adhesion thereof to the substrate was evaluated. As a result, the thickness of the conductive film was 20.0 μm (Example 9) and 19.4 μm (Example 10), respectively, and the electrical resistance (line resistance) thereof was 4.6Ω (Example 9) and 3.3Ω (Example 10), respectively. The volume resistivity thereof was 92.0 μΩ·cm (Example 9) and 64.0 μΩ·cm (Example 10), respectively. With respect to the conductive films obtained in Examples 9 and 10, the adhesion thereof to the substrate was good.

After each of the conductive pastes obtained in these examples was allowed to stand at room temperature in an atmosphere of nitrogen for one month, the presence of aggregation was checked with eyes. As a result, no aggregation was observed. The conductive pastes after being thus allowed to stand for one month were used for producing conductive films by the same method as the above-described method. As a result, the electrical resistance and volume resistivity of each of the conductive films were hardly varied.

EXAMPLES 11 AND 12

Conductive pastes (conductive filler: 67% by weight) were obtained by the same method as that in Example 1, except that a polyvinyl butyral (PVB) resin (KW-3 commercially available from Sekisui Chemical Co., Ltd.) was added in place of the polyvinylpyrrolidone (PVP) resin and that the amount thereof to be added was 3% by weight (Example 11) and 6% by weight (Example 12), respectively, with respect to the conductive filler.

These conductive pastes were used for producing conductive films by the same method as that in Example 2. By the same methods as those in Example 2, the thickness of each of the conductive films was obtained, and the electrical resistance (line resistance) thereof was measured. In addition, the volume resistivity thereof was obtained, and the adhesion thereof to the substrate was evaluated. As a result, the thickness of the conductive film was 12.4 μm (Example 11) and 15.6 μm (Example 12), respectively, and the electrical resistance (line resistance) thereof was 2.1Ω (Example 11) and 2.5Ω (Example 12), respectively. The volume resistivity thereof was 26.0 μΩ·cm (Example 11) and 39.0 μΩ·cm (Example 12), respectively. With respect to the conductive films obtained in Examples 11 and 12, the adhesion thereof to the substrate was good.

After each of the conductive pastes obtained in these examples was allowed to stand at room temperature in an atmosphere of nitrogen for one month, the presence of aggregation was checked with eyes. As a result, no aggregation was observed. The conductive pastes after being thus allowed to stand for one month were used for producing conductive films by the same method as the above-described method. As a result, the electrical resistance and volume resistivity of each of the conductive films were hardly varied.

EXAMPLE 13

A conductive paste (conductive filler: 67% by weight) was obtained by the same method as that in Example 1, except that flake-shaped coarse copper particles having an average particle diameter of 5 µm were added in place of the flake-shaped coarse copper particles having an average particle diameter of 12 µm and that the amount of the polyvinylpyrrolidone (PVP) resin to be added was 9% by weight with respect to the conductive filler.

This conductive paste was used for producing a conductive film by the same method as that in Example 2. By the same methods as those in Example 2, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 12.6 µm, and the electrical resistance (line resistance) thereof was 4.5Ω. The volume resistivity thereof was 57.0 µΩ·cm, and the adhesion thereof to the substrate was good.

After the conductive paste obtained in this example was allowed to stand at room temperature in an atmosphere of nitrogen for one month, the presence of aggregation was checked with eyes. As a result, no aggregation was observed. The conductive paste after being thus allowed to stand for one month was used for producing a conductive film by the same method as the above-described method. As a result, the electrical resistance and volume resistivity of each of the conductive films were hardly varied.

EXAMPLE 14

A conductive paste (conductive filler: 73% by weight) was obtained by the same method as that in Example 7, except that ethylene glycol (EG) containing no dispersing agent was used in place of ethylene glycol (EG) containing a surfactant of ammonium salt of naphthalene sulfonate formaldehyde condensate (MX-20451, commercially available from Kao Corporation) as the dispersing agent.

This conductive paste was used for producing conductive film by the same method as that in Example 2. By the same methods as those in Example 2, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 18.6 µm, and the electrical resistance (line resistance) thereof was 1.3Ω. The volume resistivity thereof was 24.0 µΩ·cm, and the adhesion thereof to the substrate was good.

After the conductive paste obtained in this example was allowed to stand at room temperature in an atmosphere of nitrogen for one month, the presence of aggregation was checked with eyes. As a result, no aggregation was observed. The conductive paste after being thus allowed to stand for one month was used for producing a conductive film by the same method as the above-described method. As a result, the electrical resistance and volume resistivity of each of the conductive films were hardly varied.

COMPARATIVE EXAMPLE 1

A conductive paste (conductive filler: 67% by weight) was obtained by the same method as that in Example 1, except that the polyvinylpyrrolidone (PVP) resin was not added.

This conductive paste was used for producing a conductive film by the same method as that in Example 1. By the same methods as those in Example 1, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 7.0 µm, and the electrical resistance (line resistance) thereof was 9.7Ω. The volume resistivity thereof was 68.0 µΩ·cm, and the adhesion thereof to the substrate was not good.

After the conductive paste obtained in this comparative example was allowed to stand at room temperature in an atmosphere of nitrogen for one month, the presence of aggregation was checked with eyes. As a result, no aggregation was observed. The conductive paste after being thus allowed to stand for one month was used for producing a conductive film by the same method as the above-described method. As a result, the electrical resistance and volume resistivity of the conductive film were hardly varied.

COMPARATIVE EXAMPLE 2

A conductive paste (conductive filler: 67% by weight) was obtained by the same method as that in Example 1, except that the BTA-coated fine copper particles were not used as the conductive filler.

This conductive paste was used for producing a conductive film by the same method as that in Example 1. By the same methods as those in Example 1, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 7.2 µm, and it was not possible to measure the electrical resistance (line resistance) thereof due to overload (OL), so that it was not possible to obtain the volume resistivity thereof. The adhesion thereof to the substrate was not good.

COMPARATIVE EXAMPLE 3

A conductive paste (conductive filler: 67% by weight) was obtained by the same method as that in Example 1, except that benzotriazole (BTA) was not contained in the solution A. The fine copper particles in the dispersing solution obtained in this comparative example were observed by means of a field emission type scanning electron microscope (FE-SEM) (S-4700 produced by Hitachi Ltd.). As a result, the fine copper particles were substantially spherical fine particles. The average particle diameter of the fine copper particles was calculated. As a result, the average particle diameter thereof was about 50 nm.

This conductive paste was used for producing a conductive film by the same method as that in Example 1, except that the pulse voltage was 2400 V. By the same methods as those in Example 1, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 7.6 µm, and the electrical resistance (line resistance) thereof was 14.8Ω. The volume resistivity thereof was a high value of 112.0 µΩ·cm, and the adhesion thereof to the substrate was not good.

After the conductive paste obtained in this comparative example was allowed to stand at room temperature in an atmosphere of nitrogen for one month, the presence of aggregation was checked with eyes. As a result, the change of color due to oxidation was observed, and aggregation was observed.

COMPARATIVE EXAMPLE 4

A conductive paste (conductive filler: 67% by weight) was obtained by the same method as that in Example 1, except that the flake-shaped coarse copper particles were not used.

This conductive paste was used for producing a conductive film by the same method as that in Example 1. By the same methods as those in Example 1, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 6.9 μm, and it was not possible to measure the electrical resistance (line resistance) thereof due to overload (OL), so that was not possible to obtain the volume resistivity thereof. The adhesion thereof to the substrate was not good.

COMPARATIVE EXAMPLE 5

A conductive paste (conductive filler: 67% by weight) was obtained by the same method as that in Example 1, except that terpineol (TPO) (commercially available from Wako Pure Chemical Industries, Ltd.) containing a surfactant of denaturated acrylic block copolymer (DISPERBYK-2000 commercially available from BYK-Chmemie Japan, Co., Ltd.) was used as the dispersing agent in place of the surfactant of ammonium salt of naphthalene sulfonate formaldehyde condensate (MX-2045L commercially available from Kao Corporation) serving as the dispersing agent and that ethyl cellulose (EC) (STD. 45 cP commercially available from The Dow Chemical Company) was added in place of the polyvinylpyrrolidone (PVP) resin.

This conductive paste was used for producing a conductive film by the same method as that in Example 2, except that the pulse voltage was 2200 V. By the same methods as those in Example 2, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 20.3 μm, and the electrical resistance (line resistance) thereof was 3.9Ω. The volume resistivity thereof was 78.0 μΩ·cm, and the adhesion thereof to the substrate was not good.

COMPARATIVE EXAMPLE 6

A conductive paste (conductive filler: 67% by weight) was obtained by the same method as that in Example 1, except that hydroxyethyl cellulose (HEC) resin (HEC CF-W commercially available from Sumitomo Seika Chemicals Co., Ltd.) was added in place of the polyvinylpyrrolidone (PVP) resin and that the amount thereof to be added was 1% by weight with respect to the conductive filler.

This conductive paste was used for producing a conductive film by the same method as that in Example 2, except that the pulse voltage was 2200 V. By the same methods as those in Example 2, the thickness of the conductive film was obtained, and the electrical resistance (line resistance) thereof was measured. In addition, the volume resistivity thereof was obtained, and the adhesion thereof to the substrate was evaluated. As a result, the thickness of the conductive film was 14.2 μm, and the electrical resistance (line resistance) thereof was 13.5Ω. The volume resistivity thereof was a high value of 192.0 μΩ·cm, and the adhesion thereof to the substrate was not good.

COMPARATIVE EXAMPLES 7 AND 8

Conductive pastes (conductive filler: 67% by weight) were obtained by the same method as that in Example 1, except that ethylene glycol (EG) containing no dispersing agent was used in place of ethylene glycol (EG) containing a surfactant of ammonium salt of naphthalene sulfonate formaldehyde condensate (MX-2045L commercially available from Kao Corporation) as the dispersing agent, that a polyurethane (PU) resin (TAFIGEL PUR80 commercially available from MUNZING Corporation) was added in place of the polyvinylpyrrolidone (PVP) resin and that the amount thereof to be added was 3% by weight (Comparative Example 7) and 6% by weight (Comparative Example 8), respectively, with respect to the conductive filler.

These conductive pastes were used for producing conductive films by the same method as that in Example 1, except that the pulse voltage was 2200 V (Comparative Example 7) and 2000 V (Comparative Example 8), respectively. By the same methods as those in Example 1, the thickness of each of the conductive films was obtained, and the electrical resistance (line resistance) thereof was measured. In addition, the volume resistivity thereof was obtained, and the adhesion thereof to the substrate was evaluated. As a result, the thickness of the conductive film was 7.2 μm (Comparative Example 7) and 6.2 μm (Comparative Example 8), respectively, and the electrical resistance (line resistance) thereof was 4.0Ω (Comparative Example 7) and 7.7Ω (Comparative Example 8), respectively. The volume resistivity thereof was 29.0 μΩ·cm (Comparative Example 7) and 48.0 μΩ·cm (Comparative Example 8), respectively. With respect to the conductive films obtained in Comparative Examples 7 and 8, the adhesion thereof to the substrate was not good.

COMPARATIVE EXAMPLE 9

A conductive paste (conductive filler: 67% by weight) was obtained by the same method as that in Example 1, except that the amount of the polyvinylpyrrolidone (PVP) resin to be added was 12% by weight with respect to the conductive filler.

This conductive paste was used for producing a conductive film by the same method as that in Example 2, except that the pulse voltage was 2800 V. By the same methods as those in Example 1, the thickness of the conductive film was obtained, and the electrical resistance (line resistance) thereof was measured. In addition, the volume resistivity thereof was obtained, and the adhesion thereof to the substrate was evaluated. As a result, although the adhesion of the conductive film to the substrate was good, the thickness of the conductive film was 26.4 μm, the electrical resistance (line resistance) thereof was 4.2Ω, and the volume resistivity thereof was a high value of 111.0 μΩ·cm.

Tables 1 through 3 show the producing conditions of the conductive pastes in these examples and comparative examples, and the thickness, line resistance and volume resistivity of each of the conductive films produced by using the conductive pastes.

TABLE 1

| | Fine Copper Particles | Diameter of Coarse Copper Particles (μm) | Mixing Ratio (Fine Copper Particles:Coarse Copper Particles) |
|---|---|---|---|
| Ex. 1 | BTA-Coated | 12 | 3:7 |
| Ex. 2 | BTA-Coated | 12 | 3:7 |
| Ex. 3 | BTA-Coated | 12 | 3:7 |
| Ex. 4 | BTA-Coated | 12 | 3:7 |
| Ex. 5 | BTA-Coated | 12 | 3:7 |
| Ex. 6 | BTA-Coated | 12 | 3:7 |
| Ex. 7 | BTA-Coated | 12 | 3:7 |
| Ex. 8 | BTA-Coated | 12 | 3:7 |
| Ex. 9 | BTA-Coated | 12 | 4:6 |
| Ex. 10 | BTA-Coated | 12 | 1:9 |
| Ex. 11 | BTA-Coated | 12 | 3:7 |
| Ex. 12 | BTA-Coated | 12 | 3:7 |
| Ex. 13 | BTA-Coated | 5 | 3:7 |
| Ex. 14 | BTA-Coated | 12 | 3:7 |
| Comp. 1 | BTA-Coated | 12 | 3:7 |
| Comp. 2 | — | 12 | 0:10 |
| Comp. 3 | Non-Coated | 12 | 3:7 |
| Comp. 4 | BTA-Coated | — | 10:0 |
| Comp. 5 | BTA-Coated | 12 | 3:7 |
| Comp. 6 | BTA-Coated | 12 | 3:7 |
| Comp. 7 | BTA-Coated | 12 | 3:7 |
| Comp. 8 | BTA-Coated | 12 | 3:7 |
| Comp. 9 | BTA-Coated | 12 | 3:7 |

TABLE 2

| | Solvent | Dispersing Agent | Resin Kind | Resin Molecular Weight | Amount to be added (wt %) | Concentration of Particles (wt %) |
|---|---|---|---|---|---|---|
| Ex. 1 | EG | MX-2045L | PVP | 45000 | 3 | 67 |
| Ex. 2 | EG | MX-2045L | PVP | 45000 | 6 | 67 |
| Ex. 3 | EG | MX-2045L | PVP | 45000 | 9 | 67 |
| Ex. 4 | EG | MX-2045L | PVP | 1200000 | 3 | 67 |
| Ex. 5 | EG | MX-2045L | PVP | 20000 | 9 | 67 |
| Ex. 6 | EG | MX-2045L | PVP | 45000 | 3 | 73 |
| Ex. 7 | EG | MX-2045L | PVP | 45000 | 6 | 73 |
| Ex. 8 | EG | MX-2045L | PVP | 45000 | 9 | 73 |
| Ex. 9 | EG | MX-2045L | PVP | 45000 | 9 | 67 |
| Ex. 10 | EG | MX-2045L | PVP | 45000 | 9 | 67 |
| Ex. 11 | EG | MX-2045L | PVB | — | 3 | 67 |
| Ex. 12 | EG | MX-2045L | PVB | — | 6 | 67 |
| Ex. 13 | EG | MX-2045L | PVP | 45000 | 9 | 67 |
| Ex. 14 | EG | — | PVP | 45000 | 6 | 73 |
| Comp. 1 | EG | MX-2045L | — | — | 0 | 67 |
| Comp. 2 | EG | MX-2045L | PVP | 45000 | 3 | 67 |
| Comp. 3 | EG | MX-2045L | PVP | 45000 | 3 | 67 |
| Comp. 4 | EG | MX-2045L | PVP | 45000 | 3 | 67 |
| Comp. 5 | TPO | DISPER BYK-2000 | EC | — | 3 | 67 |
| Comp. 6 | EG | MX-2045L | HEC | — | 1 | 67 |
| Comp. 7 | EG | — | PU | — | 3 | 67 |
| Comp. 8 | EG | — | PU | — | 6 | 67 |
| Comp. 9 | EG | MX-2045L | PVP | 45000 | 12 | 67 |

TABLE 3

| | Printing Plate | Pulse Voltage (V) | Thickness (μm) | Line Resistance (Ω) | Volume Resistivity (μΩ·cm) |
|---|---|---|---|---|---|
| Ex. 1 | SC500-18-29 | 2200 | 4.6 | 4.4 | 20.0 |
| Ex. 2 | ST250-30-60 | 2400 | 13.3 | 1.6 | 21.0 |
| Ex. 3 | ST250-30-60 | 2600 | 17.8 | 2.5 | 45.0 |
| Ex. 4 | SC500-18-29 | 2000 | 6.7 | 5.7 | 38.0 |
| Ex. 5 | ST250-30-60 | 2400 | 12.9 | 3.8 | 49.0 |
| Ex. 6 | ST250-30-60 | 2800 | 18.0 | 1.7 | 31.0 |
| Ex. 7 | ST250-30-60 | 2800 | 20.4 | 2.3 | 47.0 |
| Ex. 8 | ST250-30-60 | 2800 | 23.8 | 3.8 | 90.0 |
| Ex. 9 | ST250-30-60 | 2800 | 20.0 | 4.6 | 92.0 |
| Ex. 10 | ST250-30-60 | 2600 | 19.4 | 3.3 | 64.0 |
| Ex. 11 | ST250-30-60 | 2400 | 12.4 | 2.1 | 26.0 |
| Ex. 12 | ST250-30-60 | 2400 | 15.6 | 2.5 | 39.0 |
| Ex. 13 | ST250-30-60 | 2400 | 12.6 | 4.5 | 57.0 |
| Ex. 14 | ST250-30-60 | 2800 | 18.6 | 1.3 | 24.0 |
| Comp. 1 | SC500-18-29 | 2200 | 7.0 | 9.7 | 68.0 |
| Comp. 2 | SC500-18-29 | 2200 | 7.2 | OL | — |
| Comp. 3 | SC500-18-29 | 2400 | 7.6 | 14.8 | 112.0 |
| Comp. 4 | SC500-18-29 | 2200 | 6.9 | OL | — |
| Comp. 5 | ST250-30-60 | 2200 | 20.3 | 3.9 | 78.0 |
| Comp. 6 | ST250-30-60 | 2200 | 14.2 | 13.5 | 192.0 |
| Comp. 7 | SC500-18-29 | 2200 | 7.2 | 4.0 | 29.0 |
| Comp. 8 | SC500-18-29 | 2000 | 6.2 | 7.7 | 48.0 |
| Comp. 9 | ST250-30-60 | 2800 | 26.4 | 4.2 | 111.0 |

Figure 1:
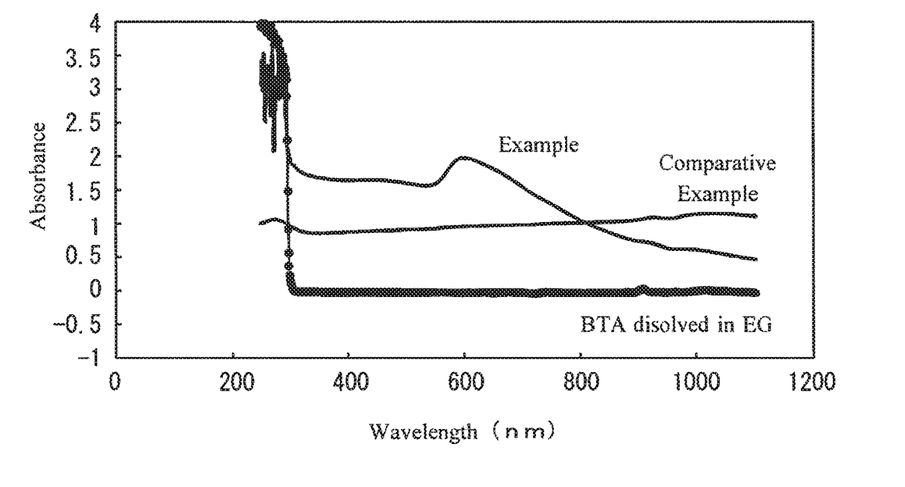
FIG. 1 is a chart showing the absorbance of a dispersing solution containing fine copper particles obtained in each of Example 1 and Comparative Example 3.

FIG. 1 shows the absorbance of dispersing solutions, in which about 0.05% by weight of the fine copper particles (coated with BTA) in Example 1 and about 0.05% by weight of fine copper particles (not coated with BTA) in Comparative Example 3 were added to ethylene glycol (EG), respectively, to be dispersed with ultrasonic waves, when the absorbance was measured at a wavelength of 250 to 1100 nm by means an ultraviolet and visible spectrophotometer (UV-1800 produced by Shimadzu Corporation). As shown in FIG. 1, in the solution in which ETA is dissolved in EG, the absorbance is increased at a wavelength of 300 nm or less due to the presence of the conjugated double band which absorbs light in the range of ultraviolet rays. Also, in the dispersing solution of the fine copper particles (coated with BTA) in Example 1, the absorbance is increased at a wavelength of 300 nm or less due to BTA coating the fine copper particles. However, it can be seen that the absorbance is not increased at a wavelength of 300 nm or less in the dispersing solution of the fine copper particles (not coated with BTA) in Comparative Example 3.

If a conductive film produced from a conductive paste according to the present invention is used for forming an antenna for an RFID tag, such as an IC tag, which is incorporated to produce an inlay (comprising an IC chip and an antenna), it is possible to produce an FEID tag, such as an IC tag, which has a practical communication range.

The invention claimed is:

1. A conductive paste comprising:
   fine copper particles having an average particle diameter of 1 to 100 nm, each of the fine copper particles being coated with an azole compound;
   coarse copper particles having an average particle diameter of 0.3 to 20 μm;
   a glycol solvent; and
   at least one of a polyvinylpyrrolidone resin and a polyvinyl butyral resin.

2. A conductive paste as set forth in claim 1, wherein a total amount of said fine copper particles and said coarse copper particles in said conductive paste is 50 to 90% by weight.

3. A conductive paste as set forth in claim 1, wherein a weight ratio of said fine copper particles to said coarse copper particles in said conductive paste is in the range of from 1:9 to 5:5.

4. A conductive paste as set forth in claim 1, wherein said azole compound is benzotriazole.

5. A conductive paste as set forth in claim 1, wherein said glycol solvent is ethylene glycol.

6. A conductive paste as set forth in claim 1, which further comprises a dispersing agent.

7. A conductive paste as set forth in claim 1, wherein said conductive paste contains the polyvinylpyrrolidone resin, and an amount of said polyvinylpyrrolidone resin in said conductive paste is 3 to 9% by weight with respect to the total amount of said fine copper particles and said coarse copper particles.

8. A conductive paste as set forth in claim 1, wherein said conductive paste contains the polyvinyl butyral resin, and an amount of said polyvinyl butyral resin in said conductive paste is 3 to 6% by weight with respect to the total amount of said fine copper particles and said coarse copper particles.

* * * * *